United States Patent
Adusumilli et al.

(10) Patent No.: US 7,159,069 B2
(45) Date of Patent: Jan. 2, 2007

(54) SIMULTANEOUS EXTERNAL READ OPERATION DURING INTERNAL PROGRAMMING IN A FLASH MEMORY DEVICE

(75) Inventors: Vijaya P. Adusumilli, San Jose, CA (US); Nicola Telecco, Santa Clara, CA (US); Abbas S. Tehrani, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 393 days.

(21) Appl. No.: 10/875,652

(22) Filed: Jun. 23, 2004

(65) Prior Publication Data

US 2005/0289314 A1    Dec. 29, 2005

(51) Int. Cl.
- *G06F 12/16* (2006.01)
- *G11C 29/00* (2006.01)
- *G11C 7/10* (2006.01)

(52) U.S. Cl. .................. 711/103; 711/150; 711/167; 711/168; 711/143; 365/189.04; 365/189.05; 365/233; 365/185.01; 714/763

(58) Field of Classification Search ............. 711/103, 711/150, 167, 168; 365/189.04, 189.05, 365/233, 185.01; 714/746, 763, 764, 773
See application file for complete search history.

(56) References Cited

U.S. PATENT DOCUMENTS

| 4,797,813 | A | * | 1/1989 | Igarashi ................... 711/118 |
| 5,214,777 | A | * | 5/1993 | Curry, Jr. ................. 711/155 |
| RE36,732 | E | | 6/2000 | Miyamoto ................ 365/203 |
| 6,216,205 | B1 | * | 4/2001 | Chin et al. ............... 711/131 |
| 2003/0076719 | A1 | | 4/2003 | Byeon et al. ............. 365/200 |

OTHER PUBLICATIONS

Printout: Samsung Electronics, "128M x 8 Bit/ 64M x 16 Bit NAND Flash Memory", 39 pages.

* cited by examiner

*Primary Examiner*—Jack A. Lane
(74) *Attorney, Agent, or Firm*—Schneck & Schneck; Thomas Schneck

(57) ABSTRACT

A system and method for performing a simultaneous external read operation during internal programming of a memory device is described. The memory device is configured to store data randomly and includes a source location, a destination location, a data register, and a cache register. The data register is configured to simultaneously write data to the destination and to the cache register. The system further includes a processing device (e.g., a microprocessor or microcontroller) for verifying an accuracy of any data received through electrical communication with the memory device. The processing device is additionally configured to provide for error correction if the received data is inaccurate, add random data to the data, if required, and then transfer the error-corrected and/or random data modified data back to the destination location.

25 Claims, 6 Drawing Sheets

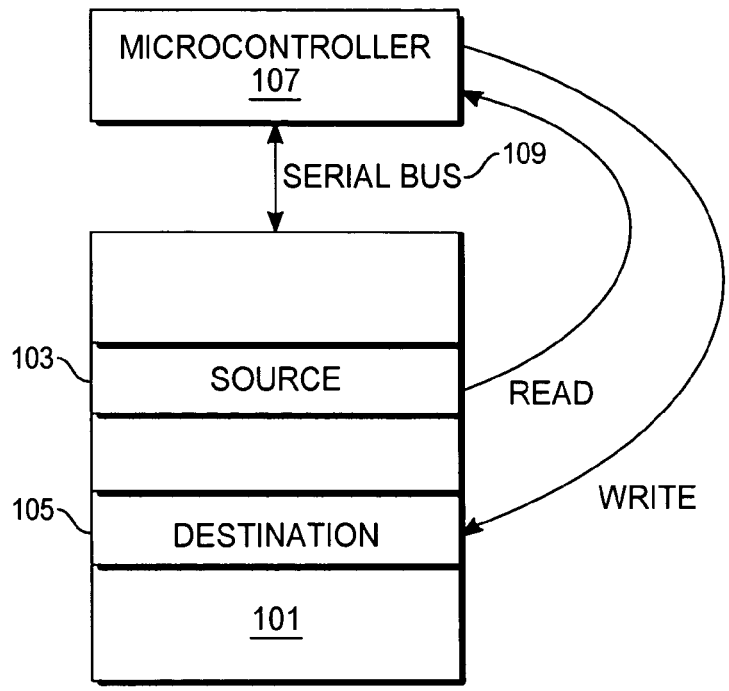
Fig._1 (Prior Art)
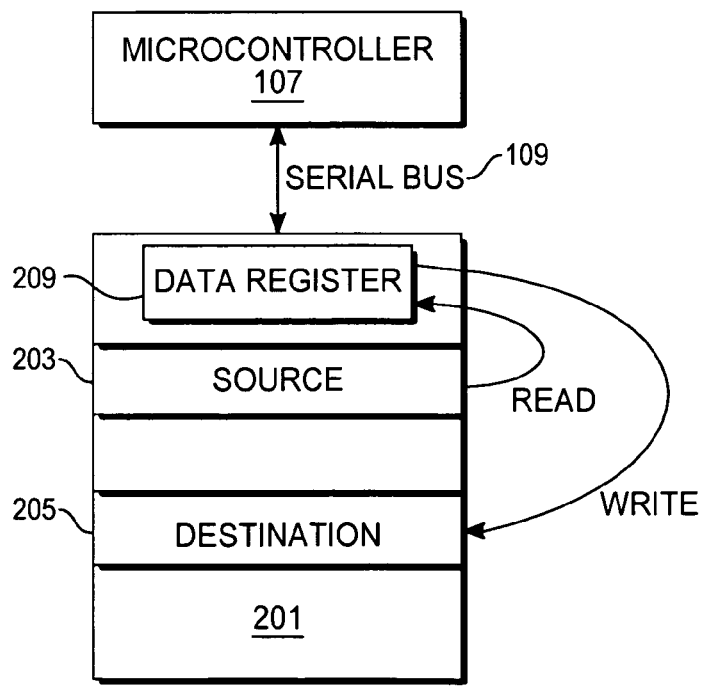
Fig._2 (Prior Art)

SIMULTANEOUS EXTERNAL READ OPERATION DURING INTERNAL PROGRAMMING IN A FLASH MEMORY DEVICE

TECHNICAL FIELD

The present invention relates to semiconductor memory devices. More particularly, the present invention relates to a system and method for performing a copy-back operation in a memory cell.

BACKGROUND ART

Semiconductor memory devices are typically classified into volatile memory devices and non-volatile memory devices. Volatile memory devices are subdivided into dynamic random access memories (DRAMs) and static random access memories (SRAMs). Non-volatile memory types include mask read-only memories (MROMs), programmable read-only memories (PROMs), erasable programmable read-only memories (EPROMs), and electrically erasable programmable read-only memories (EEPROMs). EEPROMs are increasingly used in system programming that requires continuous update or auxiliary memory devices. Particularly, flash EEPROMs are advantageous as mass storage devices because their integration density is high compared with conventional EEPROMs. Among the flash EEPROMs, a NAND-type flash EEPROM has a high integration density as compared with a NOR-type or AND-type flash EEPROM.

Currently, an operation in flash devices allows a user to copy data internally stored in one page (a page of memory is typically 256 bytes to 2 kilobytes in size) at a source address location to a destination address location directly, instead of writing out the data to an external memory and rewriting back to the destination. Thus, the operation is efficient since it only requires one step. This is one example of a copy-back operation. However, this type of copy-back is a blind operation. The user does not know if the correct data have been copied. If the data being copied are corrupted or otherwise incorrect, the data will be incorrectly written to the destination.

Thus, although this type of copy-back operation appears to increase the performance of the device, it does not ensure the reliability of data at the source. Consequently, this copy-back scheme does not prevent erroneous data from being copied to the destination address.

One of the predominant ways reliability can be ensured is by using an error correction code (ECC). Various error correction schemes may be employed to ensure the reliability of data memories. An error correction scheme can correct an error due to, for example, discharge loss, correct the integrity of the data and discard erroneous data. However for a typical error correction scheme to check data integrity, at least one additional serial random read cycle needs to be performed. The additional serial read step reduces performance of the flash device, and reduces entire system performance by tying up CPU buses and requiring CPU clock cycles to perform error correction.

FIG. 1 shows another copy-back scheme of the prior art. FIG. 1 includes a flash memory device 101, a microcontroller 107, and a serial bus 109. The flash memory device 101 contains a source address location 103 and a destination address location 105.

The flash memory device 101 may be, for example, a NAND-type device. The flash memory device 101 typically communicates with an external processing device such as the microcontroller 107 through the serial bus 109. The microcontroller 107 could also be another processing device such as a CPU or other microprocessor. To perform a copy-back operation, the microcontroller 107 first reads data contained at the source address location 103. The microcontroller 107 then writes a copy of the read data to the destination address location 105.

Finally, the microcontroller 107 verifies data written to the destination address location 105 by performing a final read operation (not shown) of the newly written data located at the destination address location 105. Although effective, typical copy-back schemes, such as shown in FIG. 1, are slow since all read and write operations between the flash memory device 101 and the microcontroller 107 must occur via the serial bus 109.

FIG. 2 shows another copy-back scheme of the prior art. In this scheme, an internal data register 209 is added to a flash memory device 201. Here, data stored at a source address location 203 are directly transferred to the data register 209. The data register 209 then transfers a copy of the data from what are stored in the source address location 203 to a destination address location 205. The system is capable of providing for a high-speed data transfer. However, there is no possibility of verifying data integrity since there is no interaction with the microcontroller 107. Typically, a microcontroller is required to perform error correction functions if necessary (e.g., such as executing an error correction code (ECC)). The presence of the data register 209 enables a caching operation so that data at the data register 209 can be modified by the microcontroller before it can be programmed at the destination address.

NAND-type flash EEPROM supports a page copy-back operation, which means data information can be copied from one page to another page without being output to an exterior. One such device is described in U.S. Pat. No. RE 36,732 to Miyamoto. The device disclosed is "a non-volatile semiconductor memory device for transferring data . . . without reading out read data to an external unit, when data is [sic] copied back" (emphasis added, Miyamoto Abstract). The Miyamoto device executes a copy-back operation by simultaneously copying memory data of one row to another row without using a CPU, thereby reducing a total copy-back time.

An additional memory device incorporating a copy-back operation is described in U.S. Patent Application Publication No. 2003/0076719 to Byeon et al. Byeon describes a "non-volatile memory device [which] . . . includes a page buffer acting as a sense amplifier during a read operation and as a write driver during a program operation. The page buffer has two sense and latch blocks, which exclusively carry out the same function. While one of the sense and latch blocks carries out a read operation, the other sense and latch block outputs previously sensed data to the exterior. Further, while one of the sense and latch blocks carries out a program operation, the other sense and latch block loads data to be programmed. Due to the page buffer, an operation speed of the non-volatile memory device can be enhanced" (emphasis added, Byeon Abstract).

However, neither Miyamoto nor Byeon et al. discloses a means to (1) verify data integrity; (2) perform error correction if data are invalid; or (3) simultaneously perform an external read operation while performing an internal programming operation.

Therefore, a system and method is needed for a flash memory device that can perform an external read operation while simultaneously performing an internal program operation, verify data integrity after a read operation and provide error correction if necessary.

DISCLOSURE OF THE INVENTION

The present invention is a system for performing a simultaneous external read operation during internal programming of a memory device by providing a mirror copy of data to be transferred in a cache register that is accessible by an external processing device. The memory device is configured to store data randomly and includes a source memory location, a destination memory location, a data register, and a cache register. The data register is configured to simultaneously write data to the destination memory location and to the cache register. The source and destination memory locations are operable to communicate electronically with the data register, and the data register is additionally operable to communicate with the cache register. The system further includes a processing device (e.g., a microprocessor or microcontroller) for verifying an accuracy of any data received through electrical communication with the memory device. The processing device is additionally configured to provide for error correction if the received data is inaccurate.

In an exemplary operation of the present invention, a microcontroller reads data stored in a cache memory while the data are being simultaneously programmed into a destination address. Additionally, the microcontroller can perform error detection and correction while the data are being programmed to the destination address.

The present invention is also a method for performing a simultaneous external read operation during internal programming in a memory device. The method includes copying original data stored at a source address location from the memory device into a data register, simultaneously copying the original data from the data register to a cache register and to a destination location, and, transferring the original data stored at the cache register to a processing device.

Once the original data is in the processing device, integrity of the original data may be verified by comparing the transferred original data with expected data stored at the source address location. This verification locates any potential errors in the transferred original data. If errors are detected, error correction can be performed on the transferred original data, thereby forming error-corrected data. Additionally, the processing device is capable of inserting additional random data into either the error-corrected data stream or into the transferred original data stream, thereby forming either modified error-corrected data or modified original data. Either the error-corrected data, the modified error-corrected data, or the modified-data is then transferred from the processing device to the cache register, followed by mirroring a copy of the data transferred from the processing device to the data register, and finally copying the data transferred from the processing device to the destination location within the memory device.

BRIEF DESCRIPTION OF THE DRAWINGS

FIG. 1 shows a prior art copy-back scheme employing a microcontroller, a flash memory device, and a serial bus linking the memory device and the microcontroller.

FIG. 2 shows another prior art copy-back scheme employing a microcontroller and a flash memory device with an internal data register, and a serial bus linking the memory device and the microcontroller.

BEST MODE FOR CARRYING OUT THE INVENTION

Figure 3:
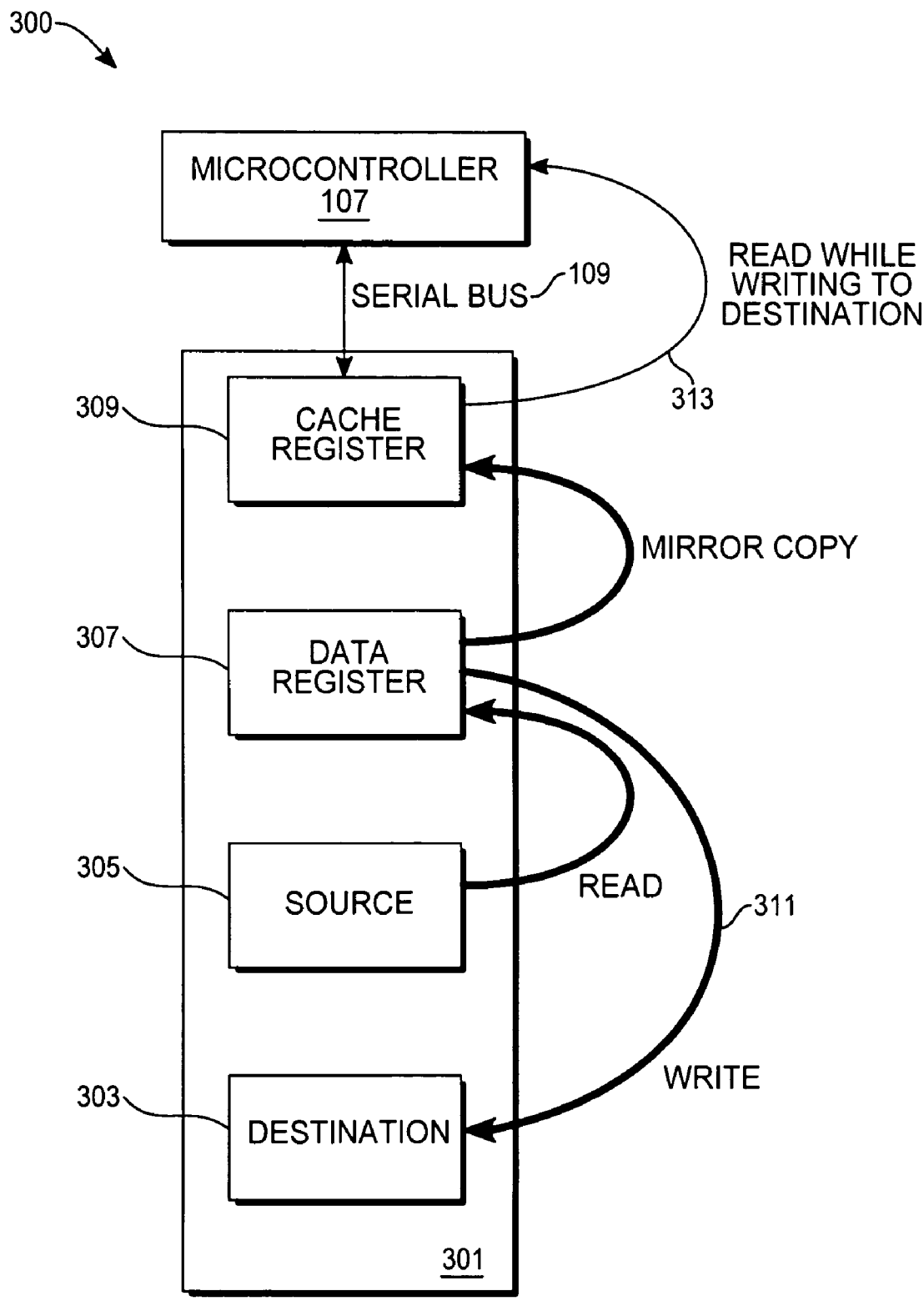
FIG. 3 shows a block diagram of the flash memory device of the present invention, a microcontroller, and a serial bus coupling the memory device and the microcontroller.

With respect to FIG. 3, a block diagram of a system 300 for performing a simultaneous external read operation during an internal programming operation in a flash device is shown. FIG. 3 includes a flash memory device 301, a destination address location 303, a source address location 305, a data register 307, and a cache register 309. A state machine (not shown), which may, for example, be co-located on an integrated circuit chip containing the flash memory device 301, is designed to control and carry out the routine, described infra.

In one embodiment, the flash memory device 301 is a NAND flash memory device. Alternatively, the flash memory device 301 could be based on either NOR or AND logic devices. Once a copy-back operation command has been asserted, data from the source address location 305 are read into the data register 307. The data read into the data register 307 may be, for example, an entire page of data. The page size, in one embodiment, consists of 256 byte or 512 bytes up to 2 kilobytes. Once the source data have been read into the data register 307, the data register 307 simultaneously writes a mirror copy of the data to the cache register 309 while simultaneously writing (i.e., programming) the data to the destination address location 303 (shown conceptually as write operation 311). Since the time required to write to a flash memory location may be considerably longer than a time required to read from a flash memory location, the mirror copy of the data stored in the cache register 309 can be read into the microcontroller 107 via the serial bus 109 (shown conceptually as read operation 313) while the data are being written to the destination source location 303. Specific relative timing for each of the aforementioned operations will be described in more detail with reference to FIG. 4.

Once at least part of the data have been transferred to the microcontroller 107, the microcontroller 107 may start to compare the data with what is expected to have been stored originally at the source address location 305. If the microcontroller 107 determines that the data have lost partial integrity, for example, through bit error due to charge loss, the microcontroller 107 can restore the data through an error correction coding technique well known to one skilled in the art. If the data were corrected for error, the microcontroller 107 will write the corrected data back to the cache register 309 serially through the serial bus 109. The cache register 309 in turn will transfer the data to the data register 307 which, in turn, will write the corrected data to the destination address location 303. Exemplary error correction operations are described in more detail with reference to FIG. 4, infra.

Even if the data doesn't require error correction, the entire operation still occurs in less time with the present invention than a total amount of time required under the prior art of FIG. 1. A significant time-savings is realized with the present invention by being able to simultaneously write data 311 to the destination location 303 while concurrently being able to read the cache register 309 and, in turn, reading data out 313 from the cache register 309 and to the microcontroller 107. Therefore, if error correction is needed, the error correction process starts contemporaneously with writing out the data to the destination location 303. In contrast, the prior art relies on exclusively sequential operational steps, which rely heavily on utilizing a serial bus and an associated bit-by-bit or byte-by-byte transfer.

In addition to performing a pure copy-back operation, the present invention can also insert additional or random data within a page along with the data read from the source address location 305. This random data insertion operation will be described more fully in conjunction with FIGS. 6 and 7.

Figure 4:
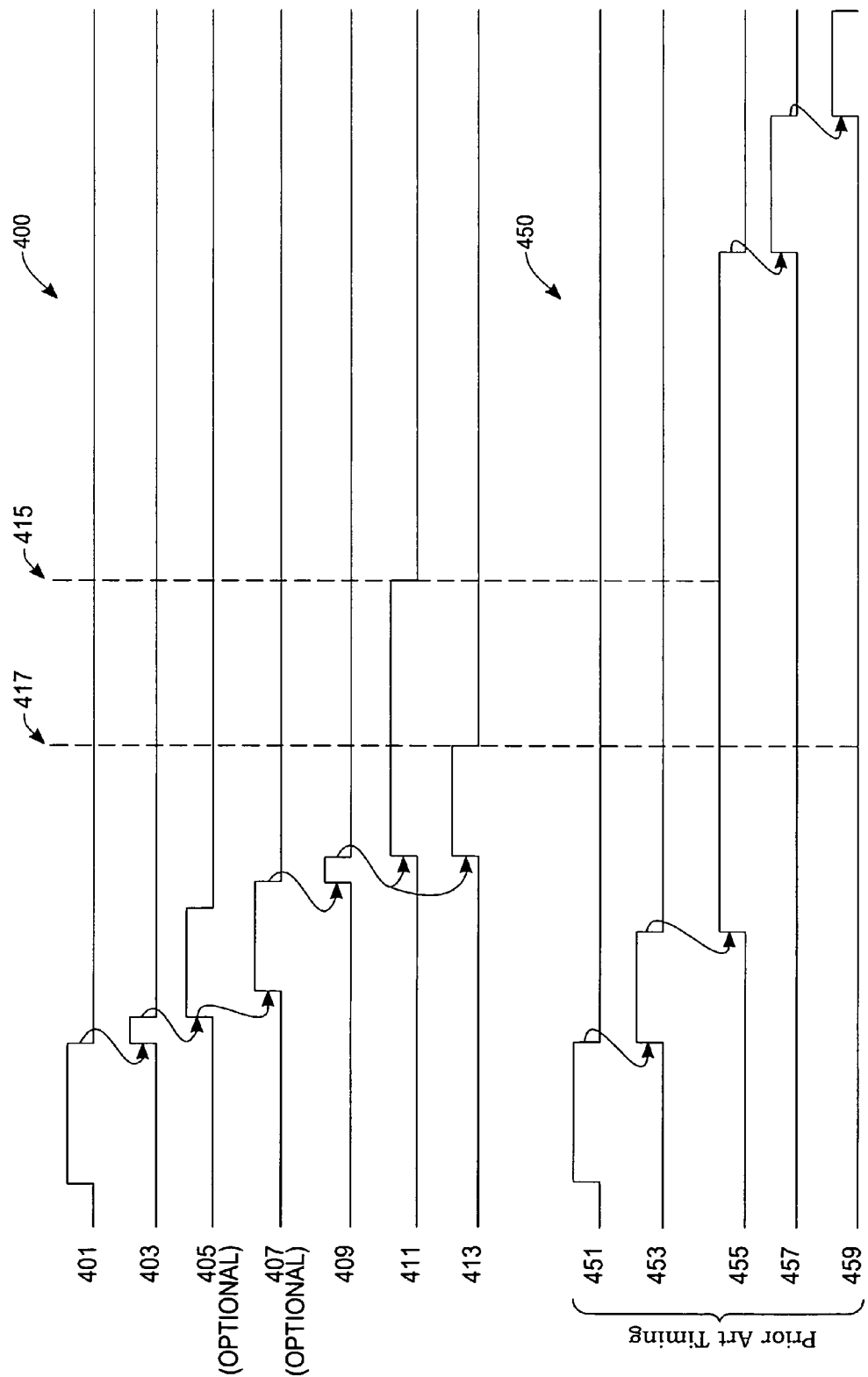
FIG. 4 shows a timing diagram showing the relative timing differences between the prior art device of FIG. 1 and the present invention of FIG. 3.

With reference to FIG. 4, a timing diagram shows the relative timing differences between the present invention and the prior art of FIG. 2. With respect to FIG. 4, trace 401 shows data being copied from the source address location 305 to the data register 307. Once copied to the data register 307, the data are written to the cache register 309 as shown by trace 403. The next two traces 405, 407 are optional.

Trace 405 represents an optional read by the microcontroller 107. If the microcontroller 107 verifies data, an integrity of the data in the source register 305 is verified and represented by trace 407. By having optional traces 405, 407, the microcontroller 107 can ensure that the data at the source location 305 have been verified and validated (e.g., this verification could be ECC). Contemporary systems are unable to accomplish the optional read step shown at trace 405.

If either an error correction/verification step or random data are added to data read from the source location 305, then data are read, in optional trace 405, from the cache register 309 to the microcontroller 107 via the serial bus 109. Either error corrected data or random data are then read from the microcontroller 107 back through the serial bus 109 into the cache register 309 as shown by optional trace 407.

Optional trace 405 indicates a data transfer from the cache register 309 to the microcontroller 107. Since data transferred from the flash memory device 301 to the microcontroller 107 via the serial bus 109 is conducted serially, a total transfer time required for writing from the cache register 309 to the microcontroller 107 is significantly longer than internal data transfers within the flash memory device 301. Once data begin to transfer to the microcontroller 107, the microcontroller 107 makes a determination whether error correction is necessary to the received data.

Additionally, the microcontroller 107 may add data randomly to selected parts of the page data read from the source address location 305. Relative timing for any error correction is shown in trace 409. Notice that the microcontroller 107 can begin error correction immediately upon receipt of at least a portion of the data.

If error correction is performed or random data are inserted, the microcontroller 107 then transfers the modified data back to the cache register 309 as shown in trace 411. A mirror copy of the modified data are transferred from the cache register 309 to the data register 307, trace 413, and finally to the destination location 303. Vertical line 415 indicates a relative time required to write corrected data to the destination location 303 after error correction has occurred or additional random data are inserted by the microcontroller 107.

Alternatively, if no error correction is needed or no random data are added (i.e., the steps shown by optional traces 405, 407 are skipped), once the data are written to the destination address location 303, the copy-back operation is now complete as indicated by vertical line 417.

With reference to FIG. 4, timing diagrams show the relative timing differences between an exemplary timing diagram 400 of the present invention and a timing diagram 450 of the prior art of FIG. 2. With respect to FIG. 4, trace 401 shows data being copied from the source address location 305 to the data register 307. Once copied to the data register 307, the data are written to the cache register 309 as shown by trace 403.

The next two traces 405, 407 are optional. Trace 405 represents an optional read step by the microcontroller 107 if the microcontroller 107 performs a step to verify an integrity of the data in the source 305 and make any modifications, as represented by trace 407. By having optional steps as shown by traces 405, 407, the microcontroller 107 ensures that the data source has been verified and validated (e.g., by ECC). Contemporary flash memory devices are unable to accomplish this (only steps shown by trace 407 can be accomplished prior to the present invention).

Alternatively, the microcontroller 107 can skip steps as shown by traces 405, 407. In this case, the microcontroller 107 loses flexibility of correcting data before programming.

If either an error correction/verification step or random data are to be added to data read from the source address location 305, then data are read, in optional trace 405, from the cache register 309 to the microcontroller 107 via the serial bus 109. Either error corrected data or random data are then read from the microcontroller 107 back through the serial bus 109 into the cache register 309 as shown by optional trace 407. Notice that if no error correction is needed or no random data are added, once the data are written to the destination address location 303, the copy-back operation is now complete as indicated by a first relative timing line 415. If error correction is performed or random data are inserted, the microcontroller 107 then transfers the modified data back to the cache register 309 as shown in trace 411. A mirror copy of the modified data are transferred from the cache register 309 to the data register 307, at trace 409, and finally to the destination location 303, trace 411. A second relative timing line 417 indicates a time required for the microcontroller 107 to do a simultaneous read to ensure the data are correctly written into the destination 303 (compare with the prior art at trace 459, discussed infra). A correct transfer of the data from the cache register 309 to the destination 303 is ensured by circuitry inside the design.

Trace 409 indicates a data transfer from the cache register 309 to the data register 307. Importantly, a data transfer can occur concurrently from the data register 307 to the destination 303 at the same time as data are being transferred from the cache register 309 to the microcontroller 107, as indicated by traces 411 and 413 respectively.

Since data transferred from the flash memory device 301 to the microcontroller 107 via the serial bus 109 is conducted serially, a total transfer time required for writing from the cache register 309 to the microcontroller 107 is longer than internal data transfers within the flash memory device 301. Once data begin to transfer to the microcontroller 107, the microcontroller 107 makes a determination whether error correction is necessary to occur in the received data.

Timing diagram 450 shows relative timing of a purely sequential process required to transfer data according to the prior art scheme shown in FIG. 2. In the prior art, data are transferred from the source address location 203 to the data register 209 at trace 451, and then into the microcontroller 107 through serial bus 109 (trace 453). Only after data are transferred to the microcontroller 107 can the data register then write data to the destination 205 (trace 455). For a final data verification or data read, data are read from the destination 205 back to the data register 209 (trace 457) and then from the data register 209 to the microcontroller 107 (trace 459). FIG. 4 indicates that, if error correction or random data insertion are required under the present invention, a copy-back operation from the data register 307 to the destination address location 303 can be completed in a period of time which is significantly less than the time required for transferring data from the source address location 203 through the data register 209 to the microcontroller 107 in the prior art (compare traces 411 and 455 with the first relative timing line 415). Even if prior art improvements can be made, it still takes an additional operation to ensure data transfer can occur.

The microcontroller 107 verifies the integrity of the data transferred from the source address location 203 and determines whether error correction is required (not shown). If any lack of data integrity is detected, the prior art process repeats again starting at trace 451. Also, note that there are no data transfer steps under the prior art that can be performed simultaneously (i.e., no data transfer steps can be performed concurrently).

Figure 5:
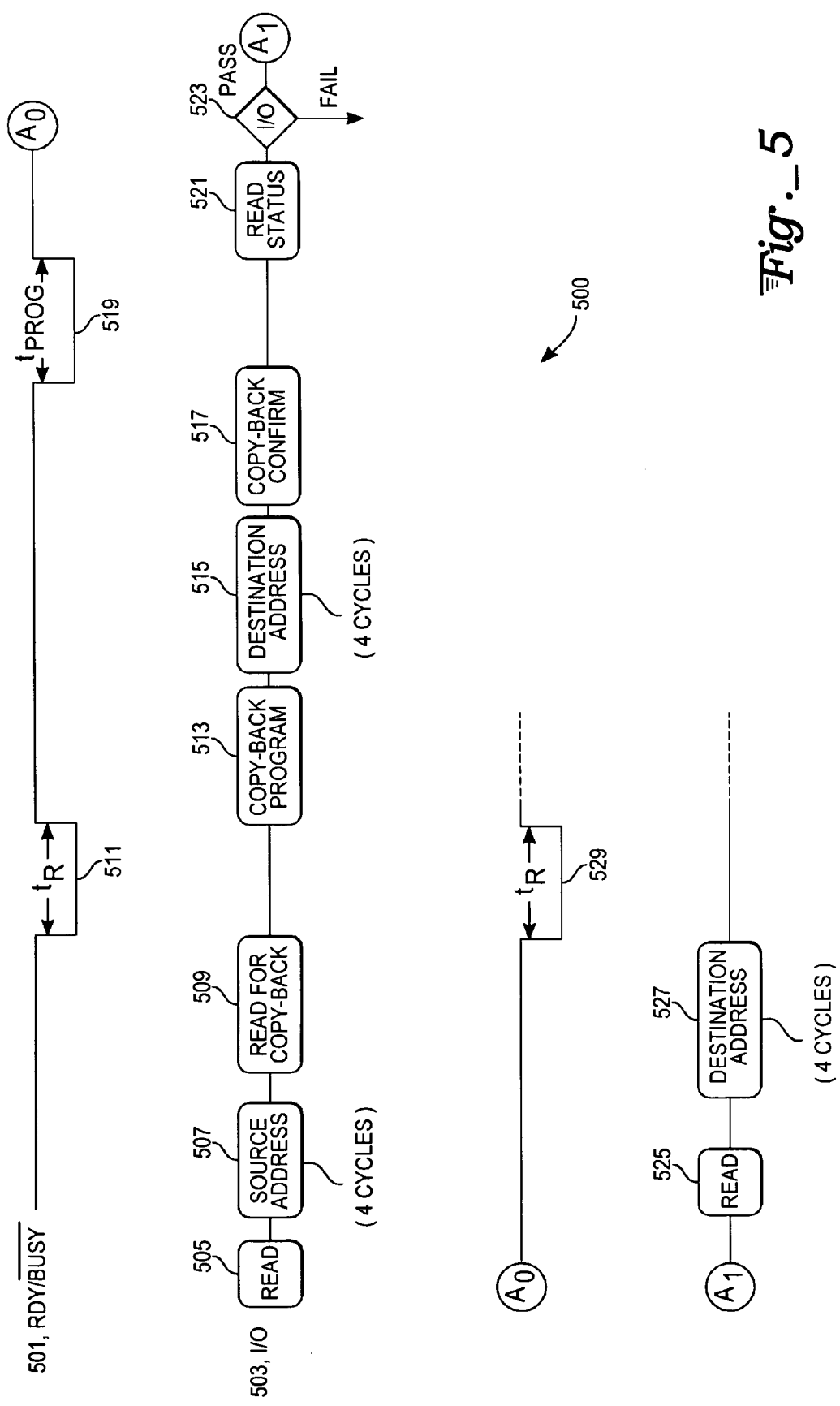
FIG. 5 shows a diagrammatic waveform of the prior art copy-back operation of FIG. 1.

FIG. 5 shows a typical waveform diagram 500 of a copy-back operation of the prior art. The waveform diagram 500 includes a RDY/BUSY signal line 501, and an I/O line 503. The waveform diagram 500 presents an overview of process steps required for the typical copy-back operation.

The copy-back operation begins with a read operation 505 followed by acquiring a source address 507 and submitting a command to read for copy-back 509. The signal line 501 indicates when a low signal is asserted on a status pin of the integrated circuit (not shown). Notice that a RDY/BUSY signal is asserted at a low logic level, indicating the device is busy during the signal going low. Therefore, during a read period, $t_R$ 511 a low logic level is asserted on the status pin, thereby preventing any other read or program/write operation from occurring. Once data at the source address location have been read, a copy-back program operation 513 begins by first determining a destination address 515 followed by a copy-back confirm operation 517 to verify that the destination address location 105 should be programmed. The signal line 501 indicates a programming (i.e., writing) period, $t_{PROG}$ 519 where a low logic level is asserted on the status pin. Generally, in a nonvolatile memory device, especially a NAND flash device, $t_{PROG} > t_R$. The process of programming is slow as a result of the programming mechanism itself (i.e., the need to generate a high voltage). A read status step is performed 521 followed by an I/O verification 523. The I/O verification 523 reports any error in the copy-back program operation by a pass/fail indication. To verify the integrity of the data written to the destination address 105, a final read step 525 is performed after the destination address is again determined 527, followed by a low logic level being asserted on the status pin during a read period, $t_R$ 529.

Figure 6:
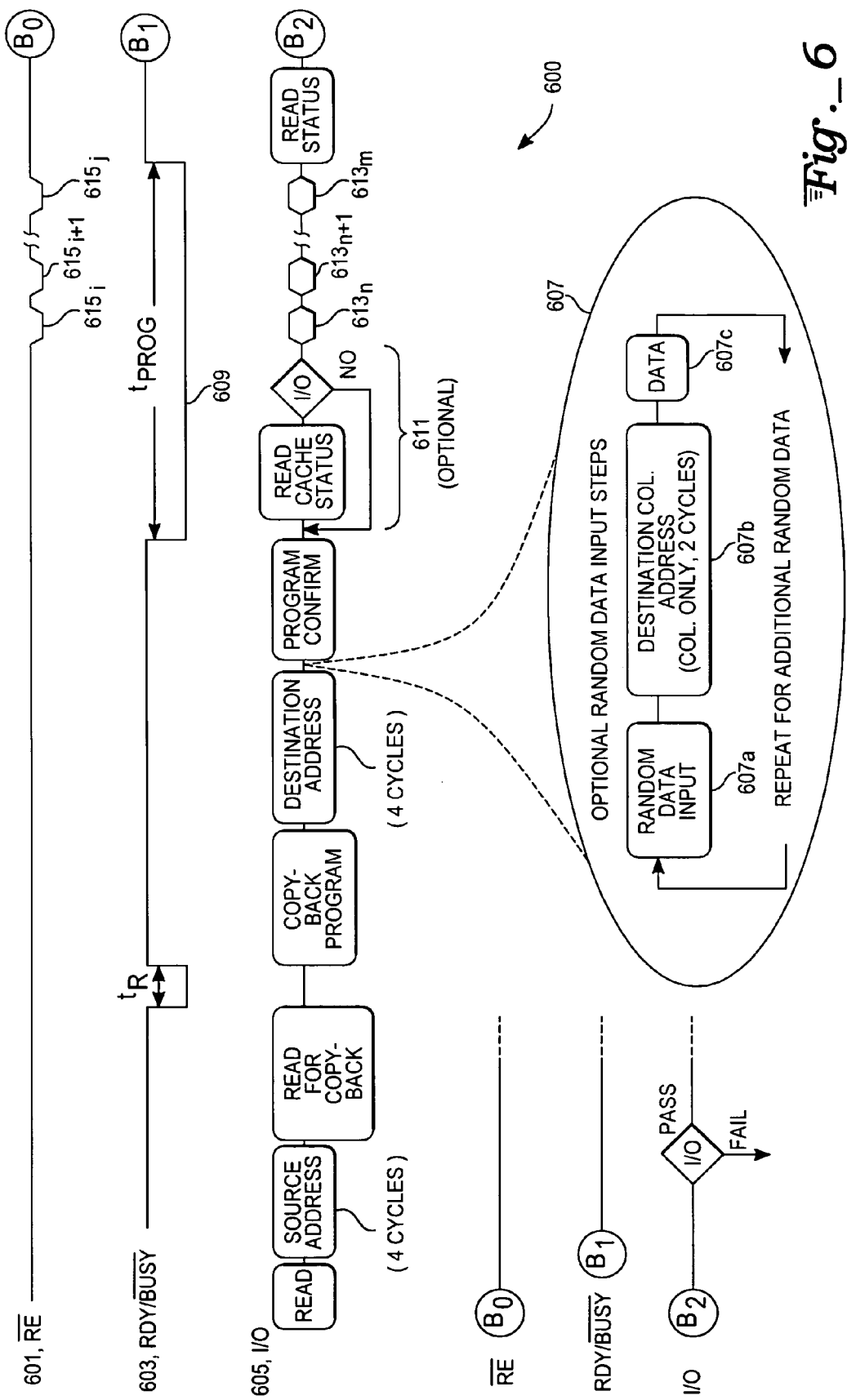
FIG. 6 shows a diagrammatic waveform employing the copy-back operation of the present invention.

With respect to FIG. 6, an exemplary waveform diagram 600 of a copy-back operation of the present invention is presented. The exemplary waveform diagram 600 includes an inverted read enable trace, $\overline{RE}$ 601, a RDY/BUSY trace 603, and an I/O trace 605.

The copy-back operation of FIG. 6 is similar to the copy-back operation of FIG. 5 with notable and significant exceptions. For example, at least one optional random data input step 607 may be inserted between a determination of the destination address and program confirmation steps. The copy-back operation of the present invention performs a read operation followed by an ensuing page program operation. Between the read and program operations, data can be read and modified by inserting additional random data inside a page. Since programming time can be significantly longer than reading time, there are significant latency periods in prior art copy-back systems. The flash memory device 301 of the present invention utilizes the latency period to simultaneously read the data that are already available inside the cache register 309 by toggling the read enable signal. Here, data are inserted into a data stream read from the source address location 305 and incorporated as part of the random data input program 607a. As part of the copy-back program inserting the original source address location 305 data, only an additional destination column address 607b is required (i.e., a row address for the random data is the same as the row address of the original data) to read 607c the data. The random data input step 607 may be repeated as often as required to incorporate various amounts of random data into various sections of the original data.

Further, an optional read status—I/O loop 611 may be performed during a programming (i.e., writing) period, $t_{PROG}$. Additionally, notice that additional data, $613_n$–$613_m$, may be read in from the cache register 309 as the read enable, $\overline{RE}$, signal is pulsed, $615_i$–$615_j$ during the programming (i.e., writing) period, $t_{PROG}$ 609. This parallel external read operation during an internal programming operation significantly reduces the time required for a copy-back operation, even when additional data are read from and programmed to the flash memory device 301. If the $t_{PROG}$ is comparable to serial access of the data to be read out, then the throughput is maximized because the idle time is minimized.

Figure 7:
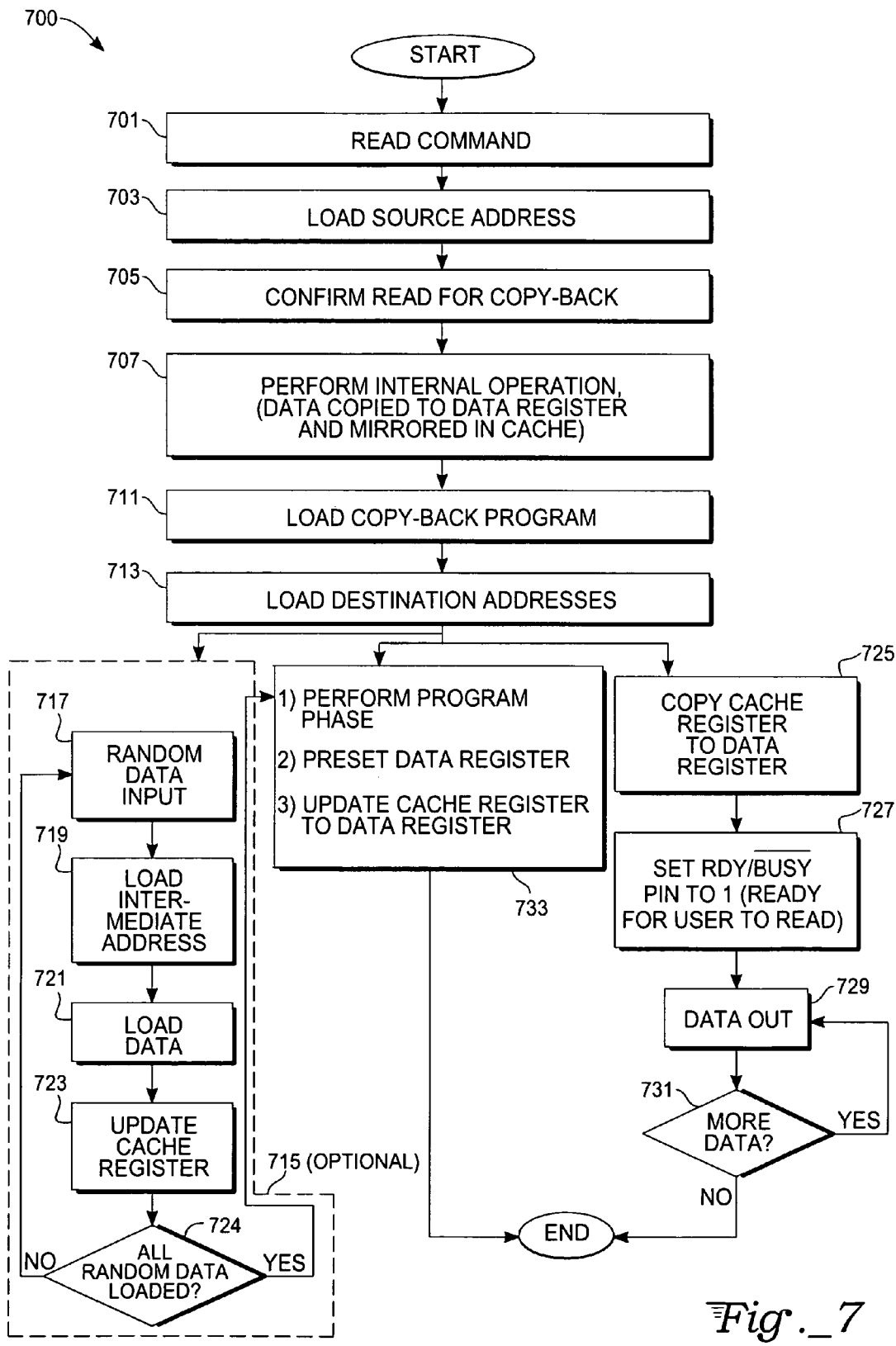
FIG. 7 shows a flowchart of the copy-back operation of the present invention.

FIG. 7 shows a process flow diagram 700 of the present invention. The process flow diagram 700 includes a read command operation 701, an operation to load a source address 703, a confirmation step of reading for copy-back 705, and a perform internal read operation step 707. The copy-back program is loaded 711 and an appropriate destination address is loaded 713.

Once the destination address is loaded 713, optional random data input steps 715 may be taken. The random data input steps 717 begin by loading an intermediate address 719, and loading the requested data 721 from the source address location 305. After the data are loaded, the cache register 309 is updated 723. A determination 724 is made whether all requested random data are loaded. If all random data are loaded, the process continues to a final step 733 to perform program phase, preset data register, and update cache register.

If, the optional random data input steps 715 are not required, the process will copy data 725 from the cache register 309 to the data register 307. The status pin (not shown) is set to a high logic level 727 indicating that the flash memory device 301 is ready for a user to read. The data are then read out 729 from the cache register 309. At step 731 a determination is made whether more data are available. If more data are available, the process loops back to the data out step 729 and will continue until data are no longer available.

Although the detailed description and drawings describe a flash memory device that allows a parallel external read operation during an internal programming operation, one skilled in the art will recognize that other embodiments can readily be contemplated without departing from the intended scope of the device described. For example, specific timing diagrams and waveforms are shown as exemplary embodiments of the flash memory device of the present invention. However, a skilled artisan could readily rearrange certain operations from either the timing or waveform diagrams while still achieving the same desired result of a reduced time for a copy-back operation to occur. Additionally, although reference is made specifically to NAND-type flash memory, a similar copy-back operation could be carried out utilizing AND- or NOR-type flash memory. Therefore, the scope of the present invention shall only be limited by the appended claims.

What is claimed is:

1. A system for performing a simultaneous external read operation during internal programming in a memory device, comprising:
    a storage means for storing data randomly, said storage means including a source memory location, a destination memory location, a data register, and a cache register, said data register configured to simultaneously write data to said destination memory location and to said cache register, said source memory location and said destination memory location operable to communicate electronically with said data register, said data register additionally operable to communicate electronically with said cache register; and
    a verification means for verifying accuracy of any data received through electrical communication with said storage means, said verification means additionally configured to provide for error correction of said data if said data is inaccurate.

2. The system of claim 1 wherein said storage means is a flash memory device.

3. The system of claim 2 wherein said flash memory device is a NAND-type device.

4. The system of claim 1 wherein said verification means is a microcontroller.

5. The system of claim 1 wherein said verification means is a microprocessor.

6. The system of claim 1 wherein electrical communications between said storage means and said verification means occurs over a serial bus.

7. The system of claim 1 wherein accuracy of said data is achieved by comparing said data with data originally stored in said source memory location.

8. The system of claim 1 wherein accuracy of said data is achieved through an error correction coding technique.

9. The system of claim 1 wherein said verification means is additionally configured to insert random data into said received data.

10. A method for performing a simultaneous external read operation during internal programming in a memory device, comprising:
    copying original data stored at a source address location in said memory device to a data register; and
    mirroring said original data copied to said data register while simultaneously copying said original data from said data register to a cache register and to a destination location.

11. The method of claim 10 further comprising:
    transferring original data stored at said cache register to a processing device;
    verifying integrity of said original data by comparing transferred original data with expected data stored at said source address location to locate potential errors in said transferred original data; and
    performing error correction on said transferred original data if any errors are detected, thereby forming error-corrected data.

12. The method of claim 11 further comprising:
    transferring error-corrected data from said processing device to said cache register;
    mirroring a copy of said error-corrected data from said cache register to said data register; and
    copying said error-corrected data from said data register to said destination location.

13. The method of claim 11 further comprising:
    adding random data to said error-corrected data prior to form modified error-corrected data;
    transferring modified error-corrected data from said processing device to said cache register;
    mirroring a copy of said modified error-corrected data from said cache register to said data register; and
    copying said modified error-corrected data from said data register to said destination location.

14. The method of claim 11 further comprising:
    adding random data to said original data to form modified data;
    transferring said modified data from said processing device to said cache register;
    mirroring a copy of said modified data from said cache register to said data register; and
    copying said modified data from said data register to said destination location.

15. The method of claim 11 wherein the processing device is a microcontroller.

16. The method of claim 11 wherein the processing device is a microprocessor.

17. A system for performing a simultaneous external read operation during internal programming in a memory device, comprising:
    a memory device for storing data randomly, said memory device including a source memory location, a destination memory location, a data register, and a cache register, said data register configured to simultaneously write data to said destination memory location and to said cache register, said source memory location and said destination memory location operable to communicate electronically with said data register, said data register additionally operable to communicate with said cache register; and
    a processing device for verifying accuracy of any data received through electrical communication with said memory device, said processing device additionally configured to provide for error correction of said data if said data is inaccurate.

18. The system of claim 17 wherein said memory device is a flash memory device.

19. The system of claim 18 wherein said flash memory device is a NAND-type device.

20. The system of claim 17 wherein said processing device is a microcontroller.

21. The system of claim 17 wherein said processing device is a microprocessor.

22. The system of claim 17 wherein electrical communications between said memory device and said processing device occurs over a serial bus.

23. The system of claim 17 wherein accuracy of said data is achieved by comparing said data with data originally stored in said source memory location.

24. The system of claim 17 wherein accuracy of said data is achieved through an error correction coding technique.

25. The system of claim 17 wherein said processing device is additionally configured to insert random data into said received data.

* * * * *